United States Patent
Kwak

(10) Patent No.: US 9,472,566 B1
(45) Date of Patent: Oct. 18, 2016

(54) SEMICONDUCTOR DEVICE AND METHOD OF MANUFACTURING THE SAME

(71) Applicant: SK hynix Inc., Gyeonggi-do (KR)

(72) Inventor: Sanghyon Kwak, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/835,406

(22) Filed: Aug. 25, 2015

(30) Foreign Application Priority Data

Mar. 25, 2015 (KR) ........................ 10-2015-0041377

(51) Int. Cl.
| | | |
|---|---|---|
| H01L 27/088 | (2006.01) | |
| H01L 29/423 | (2006.01) | |
| H01L 27/115 | (2006.01) | |
| H01L 29/78 | (2006.01) | |
| H01L 29/10 | (2006.01) | |

(52) U.S. Cl.
CPC ..... *H01L 27/11573* (2013.01); *H01L 27/0886* (2013.01); *H01L 27/11526* (2013.01); *H01L 27/11556* (2013.01); *H01L 27/11582* (2013.01); *H01L 29/1037* (2013.01); *H01L 29/42376* (2013.01); *H01L 29/7853* (2013.01)

(58) Field of Classification Search
CPC .......... H01L 27/0688; H01L 27/0886; H01L 27/11551; H01L 27/11556; H01L 29/1037; H01L 29/42356; H01L 29/42376; H01L 29/4238; H01L 29/7827; H01L 29/7853
See application file for complete search history.

(56) References Cited

U.S. PATENT DOCUMENTS

| | | | | |
|---|---|---|---|---|
| 7,838,405 | B2* | 11/2010 | Lee ................... | H01L 29/66621 257/E21.429 |
| 8,440,528 | B2* | 5/2013 | Kito .................. | H01L 27/11551 257/E21.422 |
| 2009/0294840 | A1* | 12/2009 | Gilgen ............ | H01L 21/823431 257/327 |
| 2010/0207190 | A1* | 8/2010 | Katsumata ......... | G11C 16/0483 257/319 |

FOREIGN PATENT DOCUMENTS

| | | |
|---|---|---|
| KR | 1020100004556 | 1/2010 |
| KR | 101083637 | 11/2011 |
| KR | 1020120096209 | 8/2012 |

* cited by examiner

*Primary Examiner* — Stephen W Smoot
(74) *Attorney, Agent, or Firm* — IP & T Group LLP

(57) ABSTRACT

A semiconductor device may include a substrate provided in a peripheral region, first and second insulation pillars formed in the substrate, and a gate electrode extending in a first direction from over the first insulation pillar to over the second insulation pillar, wherein the gate electrode includes first and second etch stop patterns, wherein the first etch stop pattern extends in the first direction from inside the gate electrode to over the first insulation pillar, and wherein the second etch stop pattern extends in the first direction from inside the gate electrode to over the second insulation pillar.

20 Claims, 12 Drawing Sheets

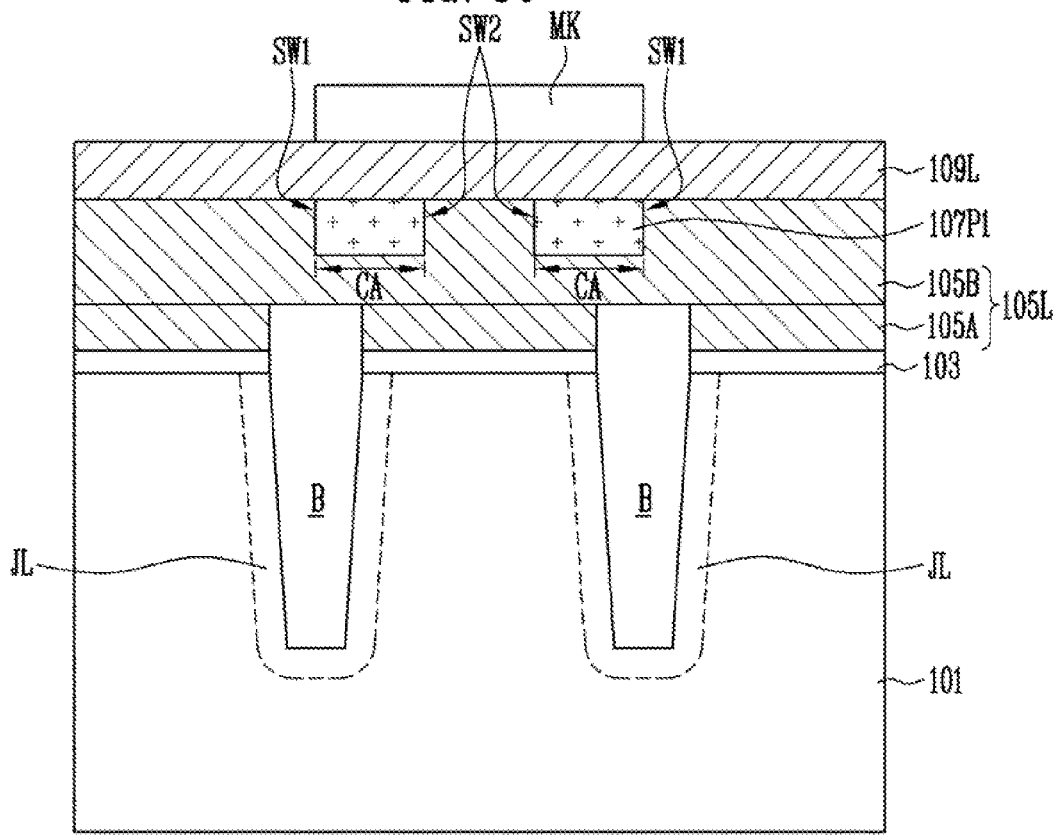
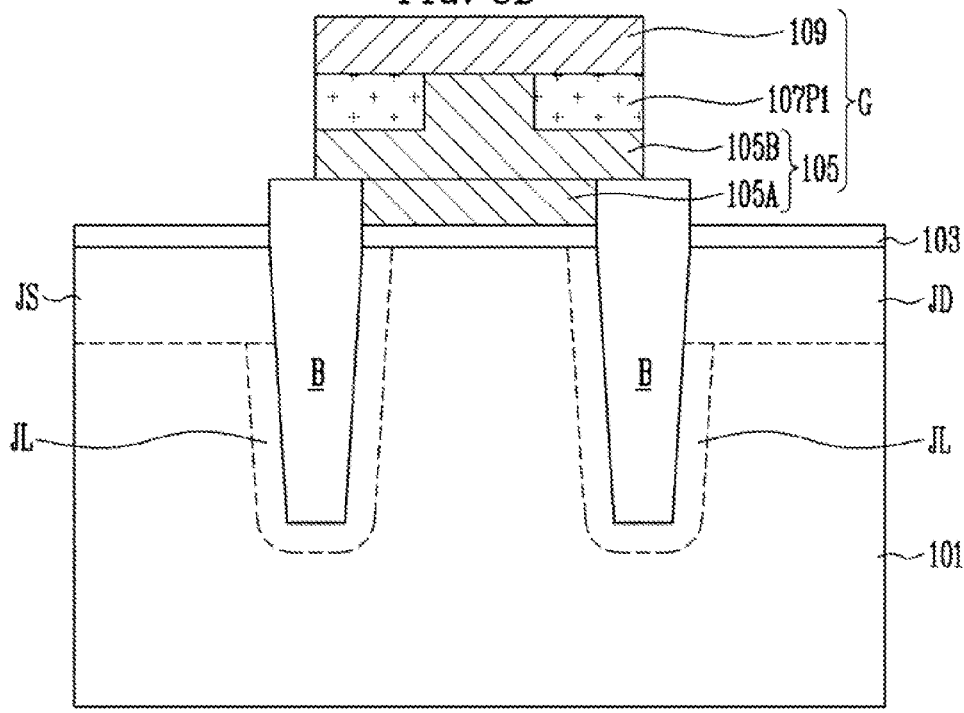

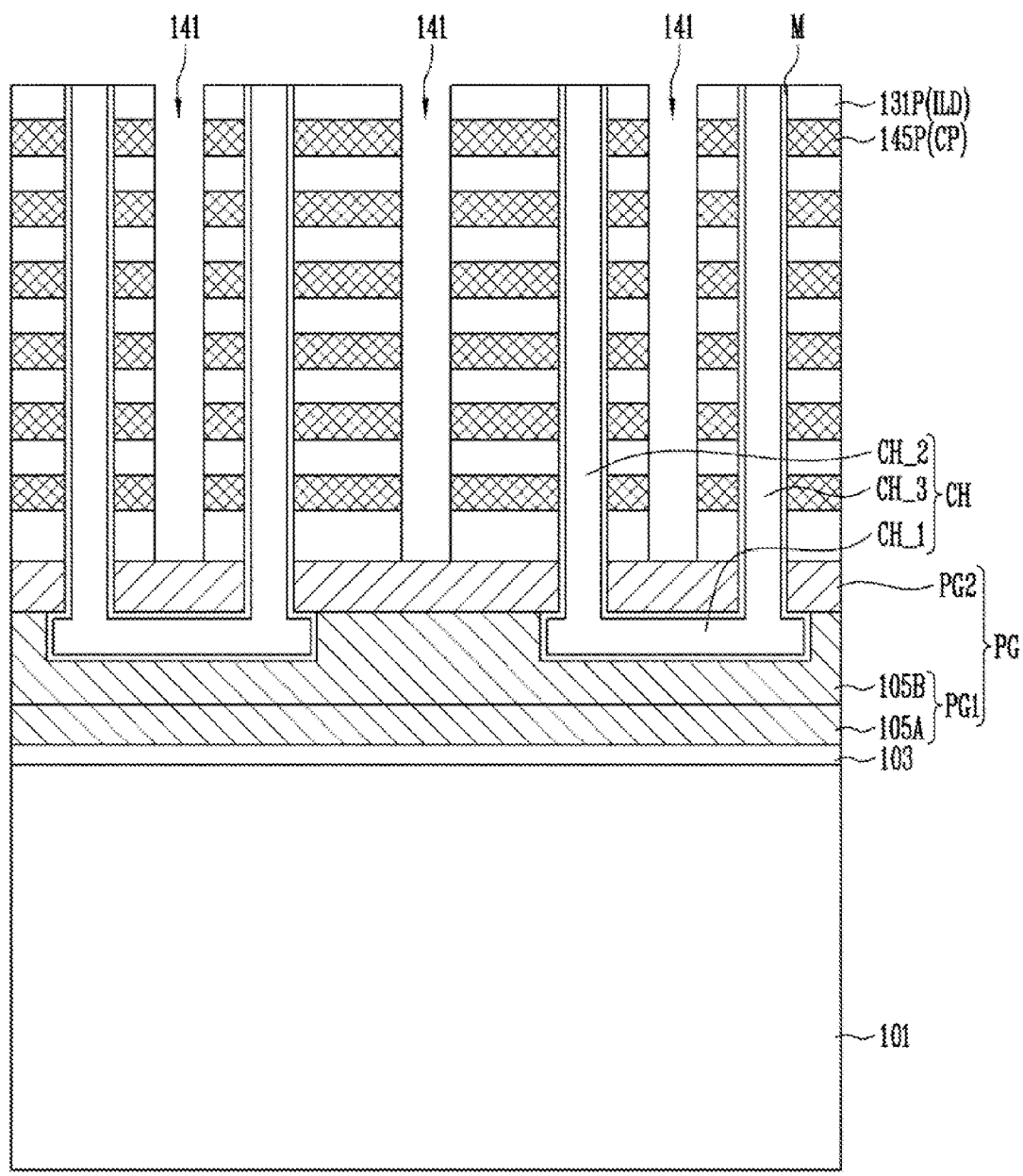

SEMICONDUCTOR DEVICE AND METHOD OF MANUFACTURING THE SAME

CROSS-REFERENCE TO RELATED APPLICATION

The present application claims priority under 35 U.S.C. 119(a) to Korean patent application number 10-2015-0041377, filed on Mar. 25, 2015, the entire disclosure of which is herein incorporated by reference in its entirety.

BACKGROUND

1. Field of Invention

Various exemplary embodiments relate generally to a semiconductor device and a method of manufacturing the same, and more particularly, to a semiconductor device including a high voltage transistor and a method of manufacturing the same.

2. Description of Related Art

A semiconductor device may include a memory device capable of storing data. The memory device may include a cell array region and a peripheral circuit region. Memory cells which store data may be arranged in the cell array region. A peripheral circuit for driving the memory cells may be arranged in the peripheral circuit region.

A high voltage may be applied to the memory cells to drive the same. The peripheral circuit may include a high voltage transistor to apply a high voltage. The high voltage transistor may be designed in various manners to endure an application of a high voltage.

SUMMARY

Various embodiments are directed to a semiconductor device which allows easy manufacture of a high voltage transistor, and a method of manufacturing the same.

According to an embodiment, a semiconductor device may include a substrate including a high-voltage transistor region in which an active region is defined, insulation pillars separated from each other and formed in the active region, a gate electrode disposed over the substrate, wherein both ends of the gate electrode overlap with the insulation pillars, respectively, and etch stop patterns buried in the gate electrode and overlapping with the insulation pillars, respectively.

According to an embodiment, a semiconductor device may include a substrate including a cell array region and a peripheral region, wherein the peripheral region includes an active region, insulation pillars separated from each other and formed in the active region in the peripheral region, a gate electrode disposed over the substrate, and wherein both ends of the gate electrode overlap with the insulation pillars, respectively, etch stop patterns buried in the gate electrode and overlapping with the insulation pillars, respectively, a pipe gate disposed over the substrate in the cell array region, a pipe trench formed in the pipe gate, and a first channel portion formed in the pipe trench.

According to an embodiment, a semiconductor device may include a substrate provided in a peripheral region, first and second insulation pillars formed in the substrate, and a gate electrode extending in a first direction from over the first insulation pillar to over the second insulation pillar, wherein the gate electrode includes first and second etch stop patterns, wherein the first etch stop pattern extends in the first direction from inside the gate electrode to over the first insulation pillar, and wherein the second etch stop pattern extends in the first direction from inside the gate electrode to over the second insulation pillar.

According to an embodiment, a method of manufacturing a semiconductor device may include forming insulation pillars separated from each other and disposed in a high-voltage transistor region of a substrate, forming an upper conductive layer of a first conductive layer over the substrate in which the insulation pillars are formed, forming etch stop patterns overlapping with the insulation pillars in the upper conductive layer, respectively, forming a second conductive layer over the upper conductive layer and covering the etch stop patterns, and forming a gate electrode having both ends overlapping with the insulation pillars, respectively, by selectively etching the second conductive layer and the upper conductive layer, wherein the etch stop patterns are buried in the gate electrode.

According to an embodiment, a method manufacturing a semiconductor device may include providing a substrate including a cell array region and a peripheral region, wherein peripheral region includes an active region, forming insulation pillars separated from each other and provided in the active region, forming an upper conductive layer of a first conductive layer (i) over the substrate and the insulation pillars in the peripheral region and (ii) over the substrate in the cell array region, forming at the same time (i) a sacrificial pattern disposed in the upper conductive layer in the cell array region and (ii) etch stop patterns overlapping with the insulation pillars, respectively, in the peripheral region, forming a second conductive layer over the upper conductive layer and covering the sacrificial pattern and the etch stop patterns, and forming at the same time (i) a gate electrode in the peripheral region and (ii) a pipe gate in the cell array region by selectively etching the second conductive layer and the upper conductive layer, wherein the gate electrode has both ends overlapping with the insulation pillars, respectively, wherein the etch stop patterns are buried in the gate electrode, wherein the sacrificial pattern is buried in the pipe gate.

BRIEF DESCRIPTION OF THE DRAWINGS

FIGS. 2A and 26 are cross-sectional views illustrating gate electrodes of a high voltage transistor according to an embodiment;

FIGS. 3A to 3D are cross-sectional views illustrating a method of manufacturing a high voltage transistor according to an embodiment;

FIGS. 5A to 5G are cross-sectional views illustrating a method of manufacturing a memory cell array according to an embodiment;

DETAILED DESCRIPTION

Figure 1A:
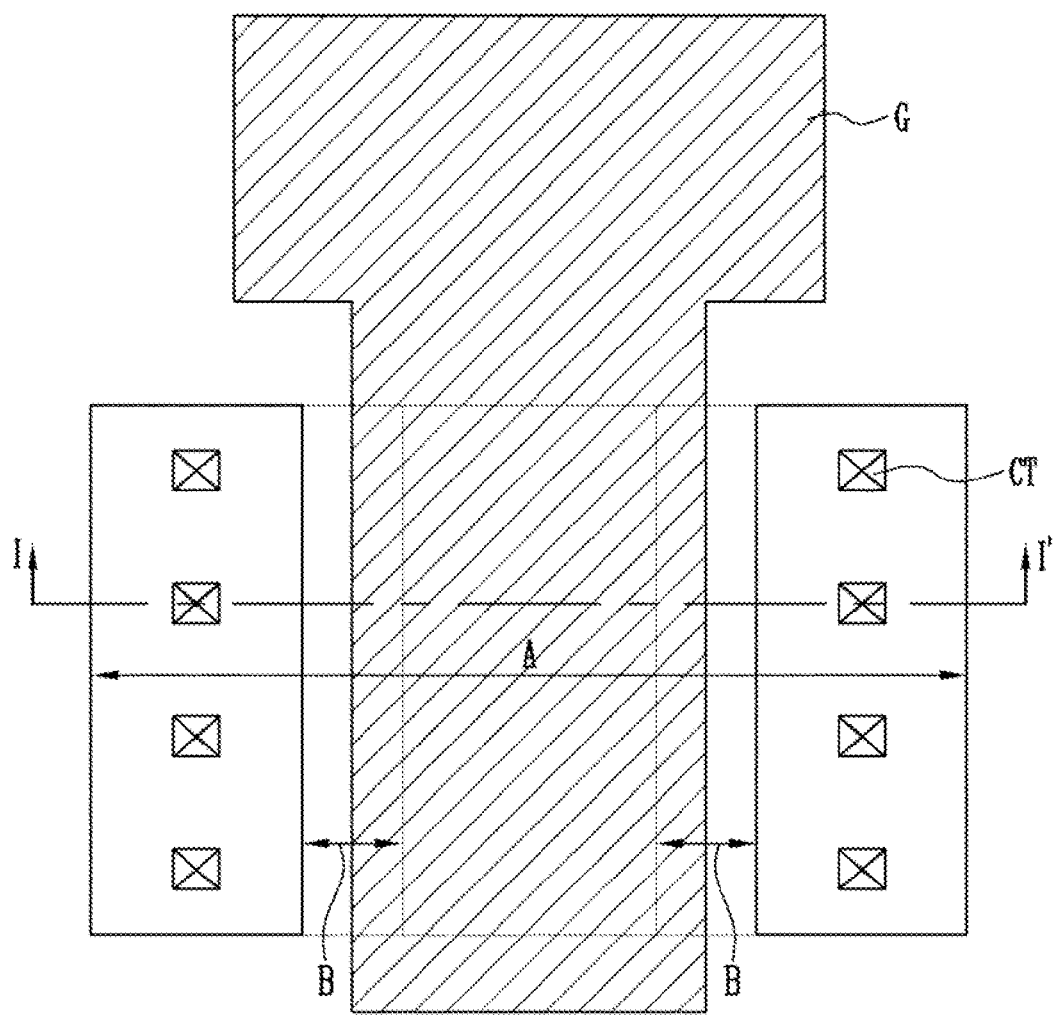
FIGS. 1A and 1B are a plan view and a cross-sectional view illustrating a high-voltage transistor region of a semiconductor device according to an embodiment.

Hereinafter, various exemplary embodiments will be described in detail with reference to the accompanying drawings. In the drawings, thicknesses and lengths of components may be exaggerated for convenience of illustration.

In the following description, a detailed description of related functions and constitutions may be omitted for simplicity and conciseness. Like reference numerals refer to like elements throughout the specification and drawings.

Figure 1B:
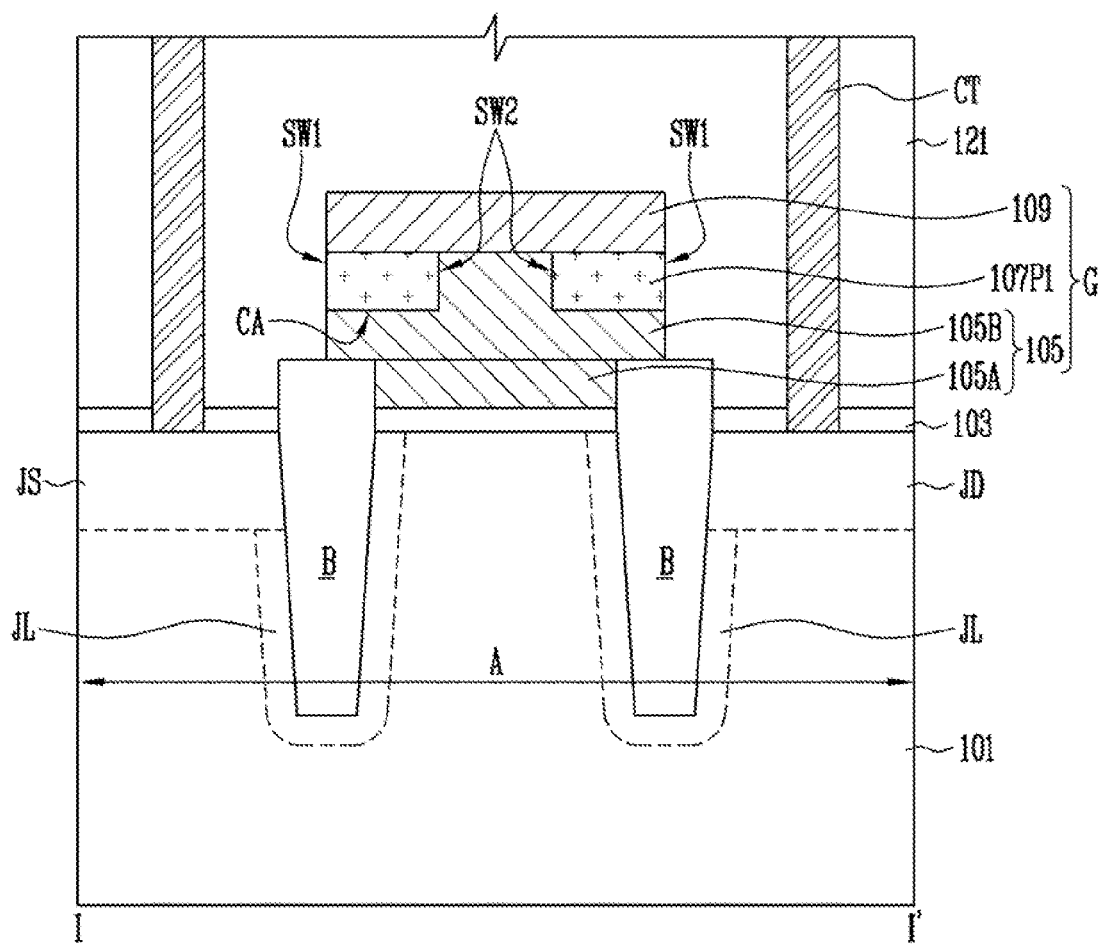

FIGS. 1A and 1B are a plan view and a cross-sectional view illustrating a high-voltage transistor region of semiconductor device according to an embodiment. The high-voltage transistor region may be disposed in a peripheral region. FIG. 1B is a cross-sectional view taken along line "I-I'" of FIG. 1A.

Referring to FIGS. 1A and 1B, an active region A may be defined in a substrate 101 corresponding to the high-voltage transistor region. The active region A may be divided by an isolation layer (not illustrated). Insulation pillars B may be formed in the active region A and are separated from each other.

According to an embodiment, a high voltage transistor may form a peripheral circuit of a semiconductor device. The high voltage transistor may be disposed over the active region A which includes the insulation pillars B. The high voltage transistor may include a gate electrode G, a source junction region 3S, a drain junction region JD and a connecting junction regions JL.

The gate electrode G may partially overlap with the active region A between the insulation pillars B. Both ends of the gate electrode G may extend toward the insulation pillars B and overlap with the insulation pillars B. The gate electrode G may be disposed over the substrate 101. A gate insulating layer 103 may be disposed between the gate electrode G and the substrate 101. The insulation pillars B may pass through the gate insulating layer 103. The gate insulating layer 103 may cover the entire top surface of the active region A. The insulation pillars B may protrude up to a higher level than an upper surface of the substrate 101.

Etch stop patterns 107P1 may be buried in the gate electrode G so that the etch stop patterns 107P1 may overlap with the insulation pillars B. Each of the etch stop patterns 107P1 may include a first sidewall SW1 and a second sidewall SW2. The first sidewall SW1 may be opened by the gate electrode G and disposed directly over one of the insulation pillars B. The second sidewall SW2 may overlap with the active region A between the insulation pillars B. The etch stop patterns 107P1 may be separated from each other. In the high voltage transistor having the above-described structure, one end of each of the etch stop patterns 107P1 may overlap with the active region A between the insulation pillars B.

The gate electrode G may include a first conductive pattern 105 and a second conductive pattern 109. The first conductive pattern 105 may include concave portions CA filled with the etch stop patterns 107P1. The second conductive pattern 109 may be disposed on the first conductive pattern 105 to contact the first conductive pattern 105. That is, the etch stop patterns 107P1 are provided between the first conductive pattern 105 and the second conductive pattern 109.

The first conductive pattern 105 may include a lower conductive layer 105A formed on the gate insulating layer 103 and an upper conductive layer 105B formed on the lower conductive layer 105A. In the high-voltage transistor region, the lower conductive layer 105A may remain between the insulation pillars B which extend up to a higher level than the substrate 101. In the high-voltage transistor region, the upper conductive layer 105B may include the concave portions CA.

In the high-voltage transistor region, the upper conductive layer 105B may overlap with a portion of each of the insulation pillars B. In the high-voltage transistor region, the second conductive pattern 109 may overlap with the etch stop patterns 107P1.

The source junction region JS and the drain junction region JD may be impurity-doped regions formed in the active region A at both ends of the gate electrode G. The connecting junction regions JL may be coupled to the source junction region JS and the drain junction region JD, respectively. The connecting junction regions JL may be impurity-doped regions formed on a surface of the substrate 101 under the insulation pillars B.

Contact plugs CT may be coupled to the source junction region JS and the drain junction region JD of the high voltage transistor, respectively. An insulating layer 121 may be formed over the substrate to cover the high voltage transistor. The contact plugs CT may pass through the insulating layer 121 and extend to the source junction region JS and the drain junction region JD, respectively.

The contact plugs CT may be located on the opposite sides with respect to the gate electrode G and the insulation pillars B, so that one of the insulation pillars B may be disposed between one of the contact plugs CT and the gate electrode G. In this structure, each of the insulation pillars B may increase an effective distance of the connecting junction region which extends between the gate electrode G and the contact plugs CT. As a result, according to an embodiment, a breakdown voltage of the high voltage transistor may be increased to improve high voltage resistance.

According to an embodiment, since both ends of the gate electrode G of the high voltage transistor overlap with the insulation pillars B, leakage current may be reduced.

Each of the insulation pillars B may have a smaller width than the isolation layer (not illustrated) by which the active region A is divided. According to an embodiment, the etch stop patterns 107P1 may be buried in the gate electrode G, so that both ends of the gate electrode G may easily overlap with the narrow insulation pillars B. The etch stop patterns 107P1 may include a protective material having an etch selectivity with respect to the first and second conductive patterns 105 and 109 and overlap with the insulation pillars B.

Therefore, while an etch process is performed to form the gate electrode G by etching the first and second conductive patterns 105 and 109, both ends of the first conductive pattern 105 disposed under the etch stop patterns 107P1 may be protected by the etch stop patterns 107P1. As a result, according to an embodiment, both ends of the first conductive pattern 105 may be aligned with the first sidewalls SW1 of the etch stop patterns 107P1, and both ends of the first conductive pattern 105 may overlap with the insulation pillars B.

The etch stop patterns 107P1 may include various materials having etch selectivities with respect to the first and second conductive patterns 105 and 109. For example, the etch stop patterns 107P1 may include various types of materials, such as an oxide layer, a nitride layer, a metal layer, a metal oxide layer, a metal nitride layer, and a combination thereof. In an embodiment, the etch stop patterns 107P1 may include SiN or TiN.

The second conductive pattern 109 formed on the etch stop patterns 107P1 may cover top surfaces of the etch stop patterns 107P1 and a top surface of the first conductive pattern 105 as shown in FIG. 1B. A width of the second conductive pattern 109 may be the same as that of the first conductive pattern 105. In another embodiment, a width of the second conductive pattern 109 may be smaller than that of the first conductive pattern 105. A width of the second conductive pattern 109 may vary by adjusting a width of a mask pattern used to pattern a gate electrode G.

Hereinafter, various examples in which the width of the second conductive pattern 109 is smaller than that of the first conductive pattern 105 are described with reference to FIGS. 2A and 2B.

Figure 2A:
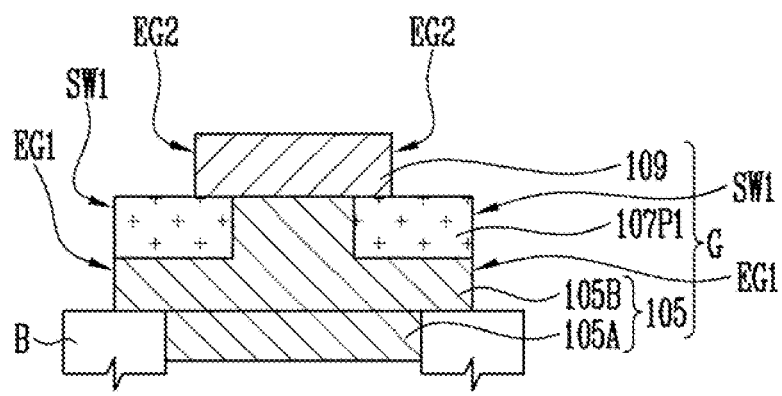
Figure 2B:
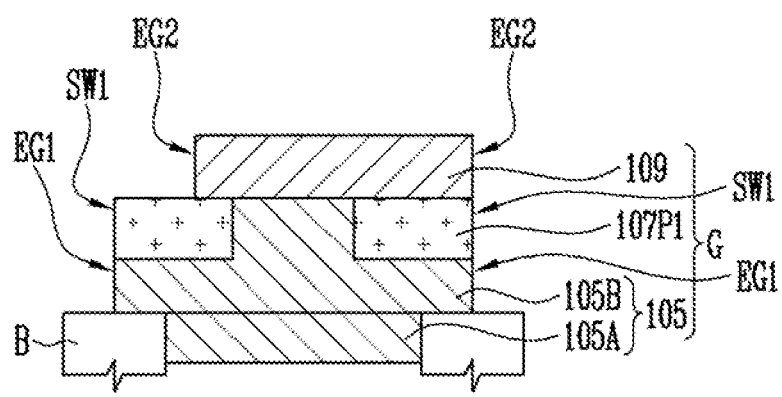

FIGS. 2A and 2B are cross-sectional views illustrating gate electrodes of a high voltage transistor according to embodiments.

Referring to FIGS. 2A and 2B, the gate electrode G may overlap with the insulation pillars B. The etch stop patterns 107P1 may be buried in the gate electrode G. The insulation pillars B and the etch stop patterns 107P1 may be formed in substantially the same manner as described above with reference to FIGS. 1A and 1B.

The gate electrode G may include the first conductive pattern 105 and the second conductive pattern 109. The first conductive pattern 105 may include the lower conductive layer 105A and the upper conductive layer 105B which are stacked on each other. The second conductive pattern 109 may be disposed on the first conductive pattern 105. A detailed structure of the first conductive pattern 105 is substantially the same as that described above with reference to FIGS. 1A and 1B.

In the high-voltage transistor region, the second conductive pattern 109 may have a smaller width than the first conductive pattern 105. At least a portion of the etch stop patterns 107P1 buried in the first conductive pattern 105 may be exposed by the second conductive pattern 109. For example, as shown in FIG. 2A, ends of both of the etch stop patterns 107P1 may be exposed by the second conductive pattern 109. However, in another example, as shown in FIG. 2B, an end of one of the etch stop patterns 107P1, which is provided between the first conductive pattern 105 and the second conductive pattern 109, may be exposed by the second conductive pattern 109.

An edge EG2 of the above-described second conductive pattern 109 may be defined by a mask pattern (not illustrated) used to etch the gate electrode. During the etch process for forming the gate electrode G, even when the first conductive pattern 105 is not blocked by the mask pattern (not illustrated), the first conductive pattern 105 may be protected by the etch stop patterns 107P1. Therefore, the edge EG1 of the first conductive pattern 105 may be aligned with the first sidewall SW1 of each of the etch stop patterns 107P1.

As described above, according to an embodiment, the width of the gate electrode G may be defined by the etch stop patterns 107P1, and the gate electrode G may overlap with the insulation pillars B.

As described above, the high voltage transistor according to the embodiment may be used to drive a memory cell array of a two-dimensional memory device or a memory cell array of a three-dimensional memory device.

FIGS. 3A to 3D are cross-sectional views illustrating a method of manufacturing a high voltage transistor according to an embodiment.

Figure 3A:
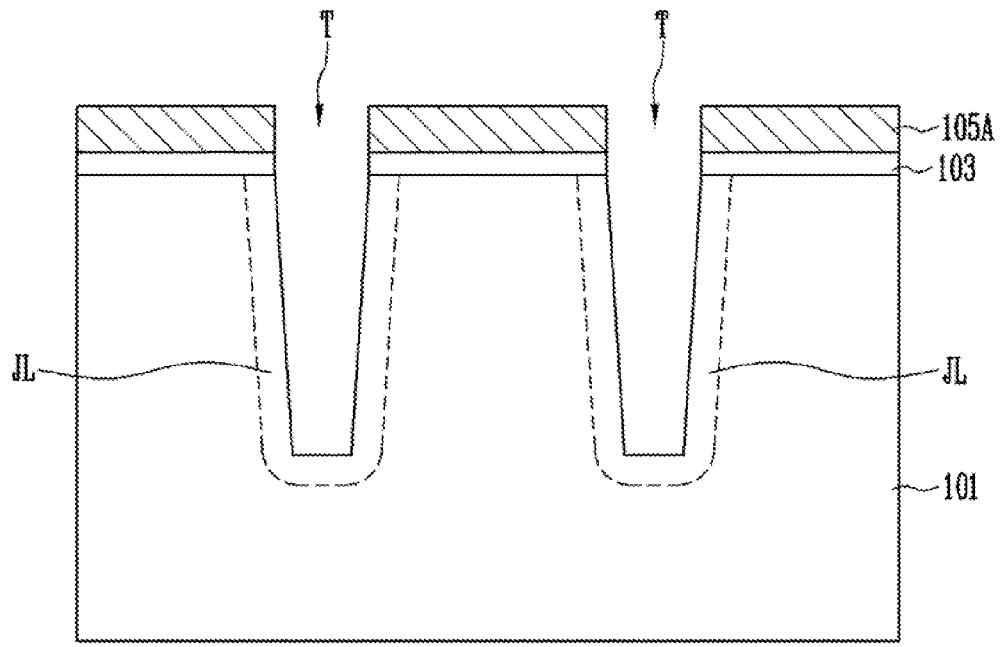
Figure 4:
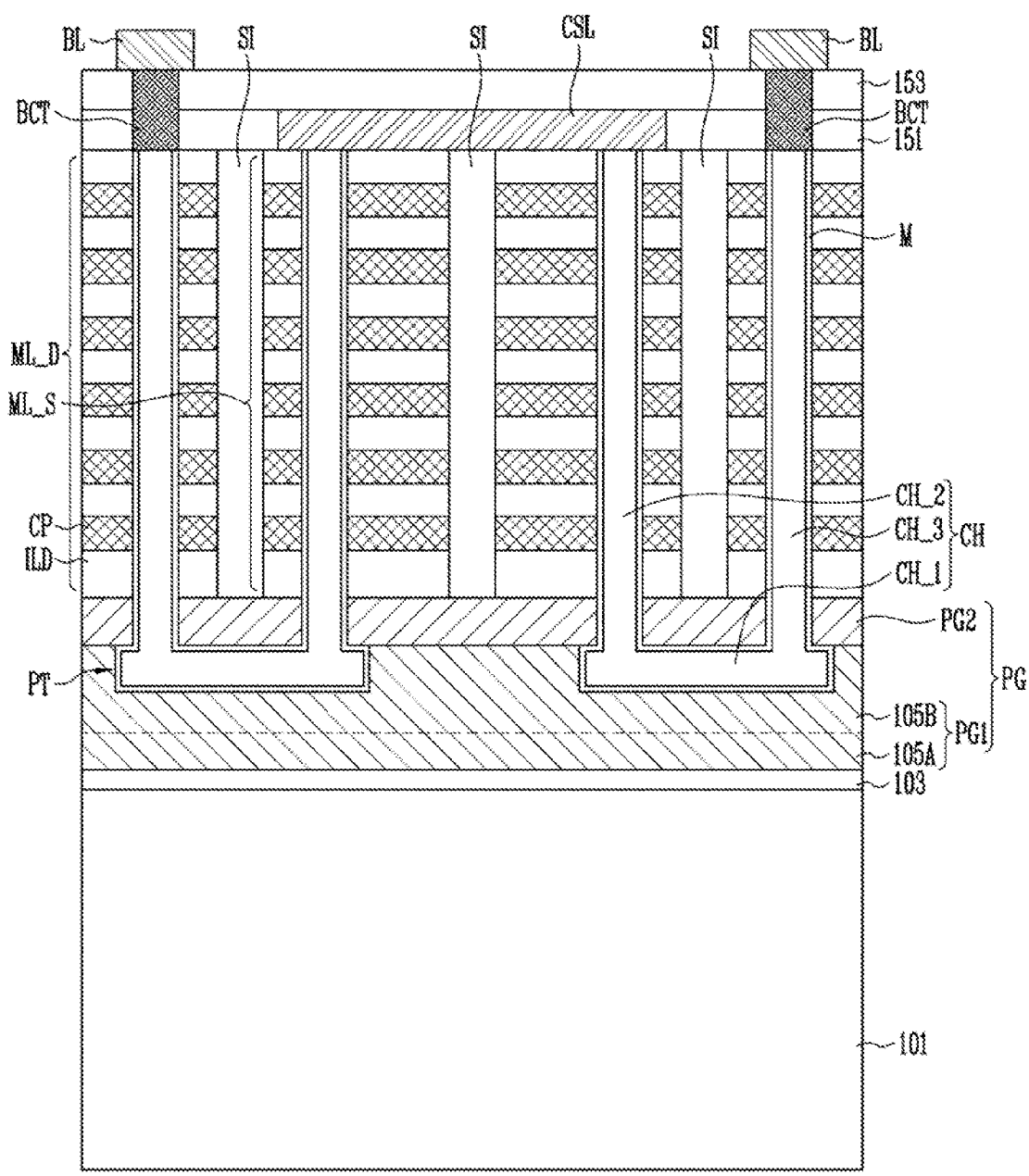
FIG. 4 is a cross-sectional view illustrating a cell array region of a semiconductor device according to an embodiment.

Referring to FIG. 3A, the gate insulating layer 103 may be formed on the substrate 101 including a peripheral region in which a high-voltage transistor region is defined. The substrate 101 may be a semiconductor substrate such as a silicon substrate. The gate insulating layer 103 may be formed by depositing an oxide layer or using a thermal oxidation method. The thickness of the gate insulating layer 103 may vary depending on areas of the substrate 101. For example, the peripheral region may include the high-voltage transistor region and a low-voltage transistor region. The gate insulating layer 103 may have a greater thickness in the high-voltage transistor region than in the low-voltage transistor region. In addition, the gate insulating layer 103 may have a greater thickness in the high-voltage transistor region than in a cell array region of the substrate 101 as shown in FIG. 4.

Subsequently, the lower conductive layer 105A may be formed on the gate insulating layer 103. Subsequently, trenches T may be formed in the high-voltage transistor region by etching the lower conductive layer 105A, the insulating layer 103, and the substrate 101. A first mask pattern (not shown) may be formed on the lower conductive layer 105A. During an etch process for forming the trenches T, the first mask pattern (not illustrated) may be used as an etch barrier.

Subsequently, the connecting junction regions JL may be formed by injecting impurities into the surface of the substrate 101 exposed through the trenches T.

Figure 3B:
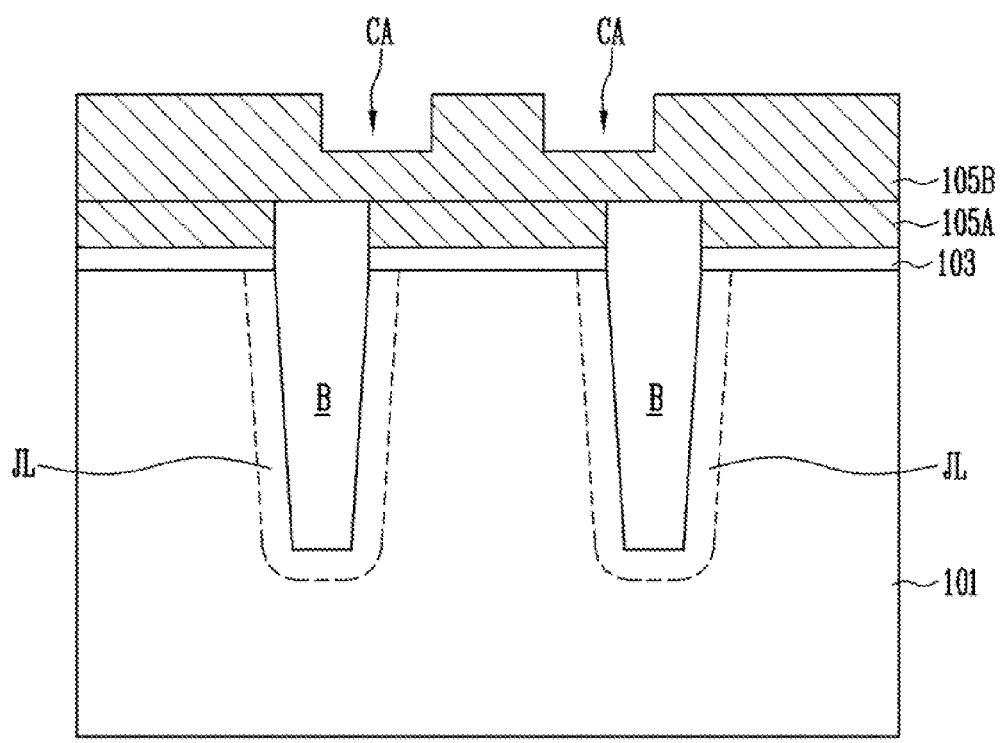

Referring to FIG. 3B, an insulating layer may be formed to fill the trenches T, and a planarization process may be performed on the insulating layer to form the insulation pillars B filling in the trenches T. The first mask pattern (not shown) may be removed after the insulation pillars B are formed.

Though not shown in FIG. 3B, an isolation insulating layer may be formed to divide the active region in the high-voltage transistor region.

Subsequently, the upper conductive layer 105B may be formed over the substrate 101 at which the insulation pillars B and the lower conductive layer 105A are formed. Then, the upper conductive layer 105B may be etched to form the concave portions CA overlapping with the insulation pillars B in the high-voltage transistor region. Each of the concave portions CA may extend from over the insulation pillars B to over the substrate 101 between the insulation pillars B. Therefore, a portion of the concave portions CA may overlap with the substrate 101 between the insulation pillars B.

A second mask pattern (not illustrated) to be used as an etch barrier may be formed on the upper conductive layer 105B to form the concave portions CA. The second mask pattern may be removed after the concave portions CA are formed. As a result, an upper surface of the upper conductive layer 105B has a stepped structure. The middle portion of the upper conductive layer 105B is located at a higher level than an end portion of the upper conductive layer 105B.

Referring to FIG. 3C, a protective material may be provided to fill the concave portions CA, that is, the step. Subsequently, the protective material may be planarized by Chemical Mechanical Polishing (CMP) to expose the upper conductive layer 105B. As a result, the etch stop patterns 107P1 may be formed in the concave portions CA.

Each of the etch stop patterns 107P1 may partially overlap with the substrate 101 between the insulation pillars B. The protective material may include various types of materials having etch selectivity with respect to the lower conductive layer 105A and the upper conductive layer 105B. For example, the protective material may include SiN or TIN. The lower conductive layer 105A and the upper conductive layer 105B, in combination, form a first conductive layer 105L.

Subsequently, a second conductive layer 109L may be formed over the first conductive layer 105L. The first conductive layer 105L may include the concave portions CA filled with the etch stop patterns 107P1. That is, the etch stop patterns 107P1 are provided between the first conductive layer 105L and the second conductive layer 109L. The second conductive layer 109L, the upper conductive layer 105B and the lower conductive layer 105A may include polysilicon.

Subsequently, a third mask pattern MK may be formed on the second conductive layer 109L. Both ends of the third mask pattern MK in the high-voltage transistor region may overlap with the etch stop patterns 107P1. A distance between the insulation pillars B may be greater than a width of each of the insulation pillars B. A width of each of the etch stop patterns 107P1 may be greater than the width of each of the insulation pillars B. Both ends of the third mask pattern MK may be placed directly over the etch stop patterns 107P1, respectively.

It is advantageous in obtaining an improved process margin, for example, a mask alignment margin, compared with aligning both ends of the third mask pattern MK with the insulation pillars B, respectively. Therefore, according to an embodiment, the align margin of the third mask pattern MK may be ensured.

In another embodiment, the width of each of the etch stop patterns 107P1 may not be greater than the width of each of the insulation pillars B. Even in this case, the align margin of the third mask pattern MK may improve by positions of the sidewalls of each of the etch stop patterns 107P1. Specifically, each of the etch stop patterns 107P1 may include the first sidewall SW1 and the second sidewall SW2. The first sidewall SW1 may be disposed directly over one of the insulation pillars B. The second sidewall SW2 may be disposed directly over the active region between the insulation pillars B.

In such a structure, since the etch stop patterns 107P1 extends to over the active region between the insulation pillars B, the align margin of the third mask pattern MK significantly improves. For example, even when the third mask pattern MK is misaligned and thus an end of the third mask pattern MK is placed directly over the active region between the insulation pillars B, the first conductive layer 105L may be protected from etching due to the etch stop patterns 107P1. Positions of the first and second sidewalls SW1 and SW2 of each of the etch stop patterns 107P1 may be determined by the position of the concave portions CA.

Referring to FIG. 3D, the gate electrode G may be formed by selectively etching the second conductive layer 109L and the first conductive layer 105L by an etch process using the third mask pattern MK as an etch barrier. After the etch stop patterns 107P1 are formed to overlap with the insulation pillars B, the third mask pattern MK may be formed. Therefore, even when the third mask pattern MK is misaligned and thus does not overlap with the insulation pillars B, a portion of the first conductive layer 105L which is not protected by the third mask pattern MK may be protected by the etch stop patterns 107P1. Therefore, even when the second conductive layer 109L is patterned and does not overlap with the insulation pillars B due to an alignment error of the third mask pattern MK, the first conductive layer 105L may overlap with the insulation pillars B.

Subsequently, impurities may be injected into the substrate 101 at both sides of the gate electrode G to form the source junction region JS and the drain junction region JD coupled to the connecting junction region L. The third mask pattern MK may be removed after the gate electrode G is formed.

As described above, the gate electrode G may be patterned by aligning the etch stop patterns 107P1 overlapping with the insulation pillars B in the high-voltage transistor region. However, the embodiment is not limited in patterning the gate electrode of a high-voltage transistor, but is applicable to various patterning processes employing self-alignment patterning techniques.

For example, the above-mentioned embodiment for forming the high voltage transistor as described above with reference to FIGS. 3A to 3D may be applied while forming a memory string in a cell array region. Hereinafter, referring to FIGS. 4 and 5A to 5G, a cell array region and an example of forming a memory string in the cell array region are described in detail.

FIG. 4 is a cross-sectional view illustrating a cell array region of a semiconductor device according to an embodiment. As shown in FIG. 4, for example, the cell array region may include a three-dimensional memory device.

Referring to FIG. 4, a three-dimensional memory device according to an embodiment may include a channel layer CH including first to third channel portions CH_1 to CH_3, a pipe gate PG, a source side stacked body ML_S, and a drain side stacked body ML_D.

The pipe gate PG may be disposed over the substrate 101 corresponding to the cell array region. The gate insulating layer 103 may be disposed between the substrate 101 and the pipe gate PG. The pipe gate PG formed in the cell array region and shown in FIG. 4 may be disposed at the same level as the gate electrode G which is formed in the peripheral region as described above with reference to FIG. 1. More specifically, the pipe gate PG may include a first pipe gate pattern PG1 and a second pipe gate pattern PG2. The second pipe gate pattern PG2 may be disposed on the first pipe gate pattern PG1.

The first pipe gate pattern PG1 formed in the cell array region may be disposed at the same level as the first conductive pattern 105 formed in the peripheral region as described above with reference to FIG. 1. The first pipe gate pattern PG1 may have the same stacked structure as the first conductive pattern 105 described above with reference to FIG. 1. That is, the first pipe gate pattern PG1 may have a stacked structure including the lower conductive layer 105A and the upper conductive layer 105B. The second pipe gate pattern PG2 formed in the cell array region may be disposed at the same level as the second conductive pattern 109 formed in the peripheral region as described above with reference to FIG. 1.

The channel layer CH may include the first channel portion CH_1, and the second channel portion CH_2 and the third channel portion CH_3 extending from the first channel portion CH_1. The first channel portion CH_1 extends between the second channel portion CH_2 and the third channel portion CH_3. The first channel portion CH_1 may be disposed in the pipe trench PT. The pipe trench PT may be disposed at the same level as the etch stop patterns 107P1 formed in the peripheral region as described above with reference to FIG. 1. The second and third channel portions CH_2 and CH_3 may pass through the second pipe gate pattern PG2 which covers the first channel portion CH_1 and the first pipe gate pattern PG1.

The channel layer CH may be disposed in a through hole. The channel layer CH may include a tubular semiconductor layer surrounding a central portion filled with an insulating material. In another example, the channel layer CH may include a buried semiconductor layer. In another example, the channel layer CH may include a combination of both. An outer wall of the channel layer CH may be surrounded by a multilayer film M. For example, the multilayer film M may include a tunnel insulating layer, a data storage layer, a blocking insulating layer, and the like.

A source side stacked body ML_S surrounding the second channel portion CH_2 and a drain side stacked body ML_D surrounding the third channel portion CH_3 may be formed over the second pipe gate pattern PG2. Each of the source side stacked body ML_S and the drain side stacked body ML_D may include interlayer insulating patterns ILD and conductive patterns CP which are stacked alternately with each other.

The source side stacked body ML_S and the drain side stacked body ML_D may be separated by a slit insulating layer SI. At least one of the conductive patterns under the uppermost conductive pattern CP of the source side stacked body ML_S may serve as a source selection line, and the remaining lower conductive patterns may serve as word lines. At least one of the conductive patterns under the uppermost conductive pattern CP of the drain side stacked body ML_D may serve as a drain selection line, and the remaining lower conductive patterns may be used as word lines.

The source side stacked body ML_S and the drain side stacked body ML_D may have substantially the same height. A source line SL and a bit line BL may be disposed over the source side stacked body ML_S and the drain side stacked body ML_D, respectively. The source line SL and the bit line BL may be separated from each other. For example, the bit line BL may be separated from and disposed above the source line SL.

The source line SL may be electrically coupled to the second channel portion CH_2. The source line SL may be formed in a first upper insulating layer 151 which covers the source side stacked body ML_S and the drain side stacked body ML_D.

The bit line BL may be formed on a second upper insulating layer 153 which covers the source line SL and the first upper insulating layer 151. The bit line BL may be electrically coupled to the third channel portion CH_3 through a bit line contact plug BCT passing through the second upper insulating layer 153 and the first upper insulating layer 151.

As described above, a pipe transistor may be formed at an intersection between the pipe gate PG and the channel layer CH. Memory cells may be formed at intersections between the word lines and the channel layer CH. A source selection transistor may be formed at an intersection between the source selection line and the channel layer CH. A drain selection transistor may be formed at an intersection between the drain selection line and the channel layer CH. Thus, a memory string is formed of the drain selection transistor, the memory cells, the pipe transistor, and the source selection transistor which are coupled in series along the channel layer CH. The memory string may be coupled between the bit line BL and the source line SL.

FIGS. 5A to 5G are cross-sectional views illustrating a method of manufacturing a memory cell array according to an embodiment. FIGS. 5A to 5G are cross-sectional views illustrating a method of manufacturing a three-dimensional memory device shown in FIG. 4. A substrate shown in FIGS. 5A to 5G corresponds to a part of the substrate in FIGS. 3A to 3D. More specifically, the substrate shown in FIGS. 5A to 5G corresponds to a cell array region.

Figure 5A:
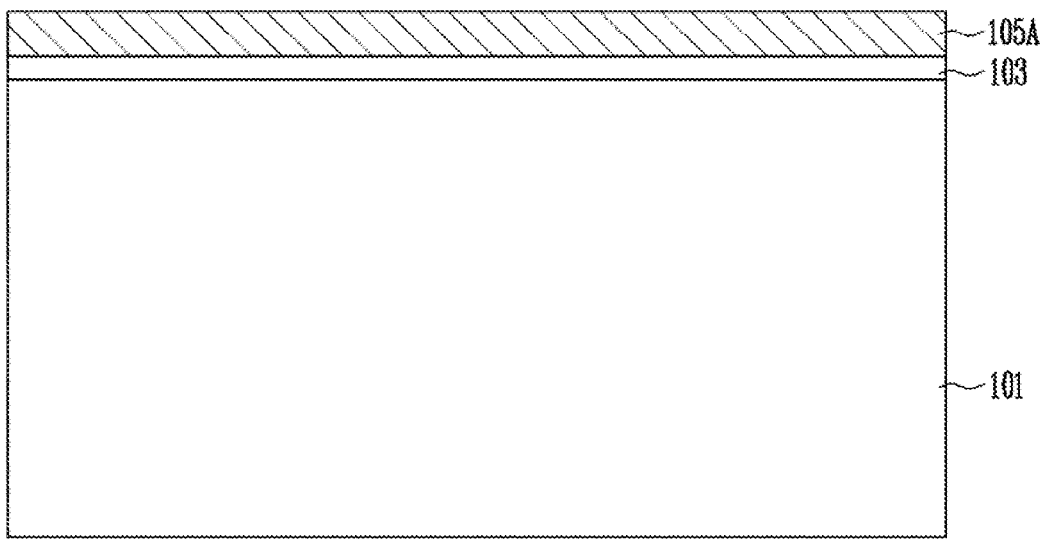

Referring to FIG. 5A, the gate insulating layer 103 may be formed on the substrate 101 including the cell array region. Subsequently, the lower conductive layer 105A may be formed on the gate insulating layer 103. The gate insulating layer 103 and the lower conductive layer 105A as shown in FIG. 5A may extend from the gate insulating layer and the lower conductive layer formed in the peripheral region as shown in FIG. 3A, respectively.

Subsequently, the process for forming trenches and the process for forming connecting junction regions in the peripheral region or the high-voltage transistor region as shown in FIG. 3A and the process for forming insulation pillars in the peripheral region or the high-voltage transistor region as shown in FIG. 3B may be performed.

Figure 5B:
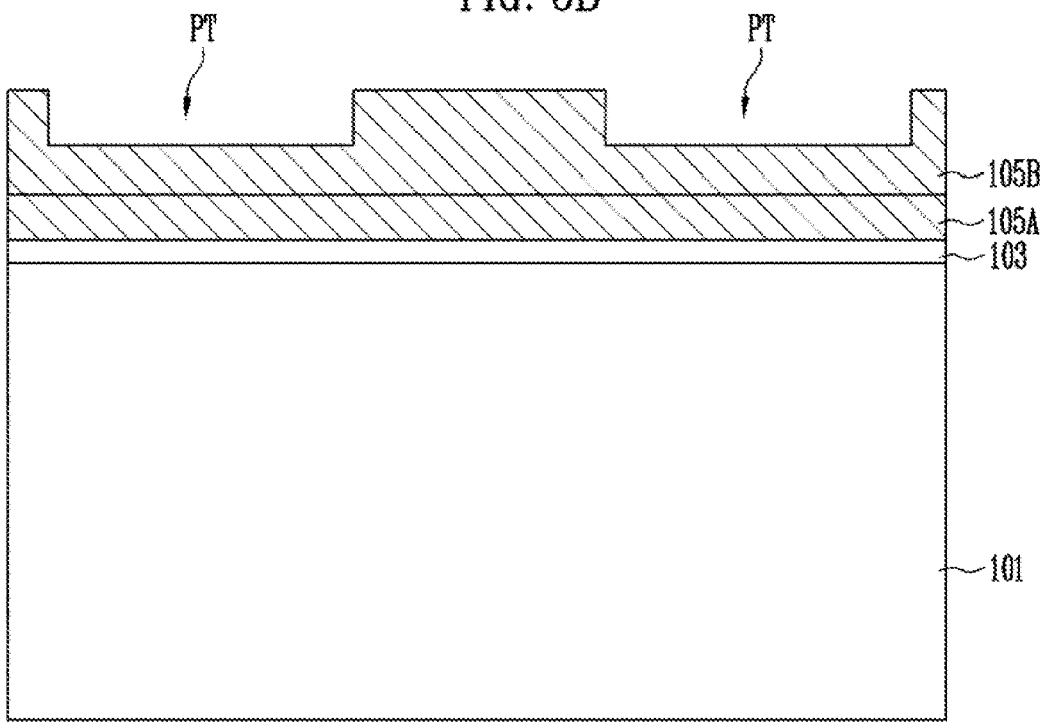

Referring to FIG. 5B, the upper conductive layer 105B may be formed over the substrate 101 on which the lower conductive layer 105A is formed. The upper conductive layer 105B shown in FIG. 5B may extend from the upper conductive layer formed in the peripheral region or the high-voltage transistor region as shown in FIG. 3B.

Subsequently, the pipe trench PT may be formed in the cell array region by etching the upper conductive layer 105B. The pipe trench PT may be formed at the same time when the concave portions are formed in the peripheral region or the high-voltage transistor region as illustrated in FIG. 3C.

Figure 5C:
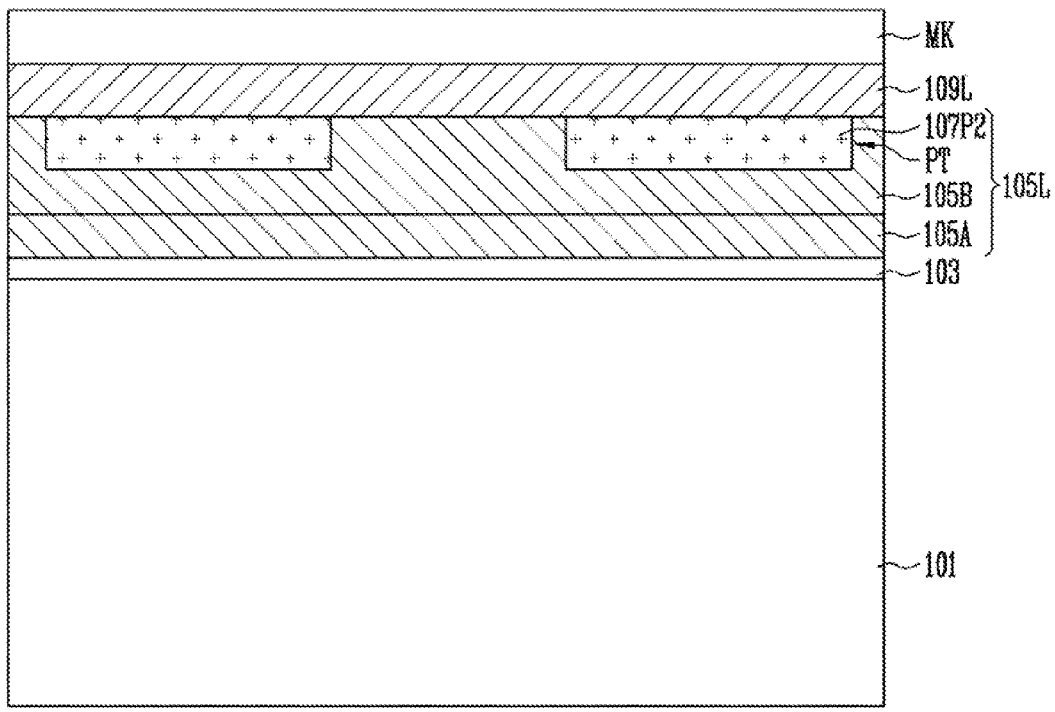

Referring to FIG. 5C, a protective material may be formed to fill the pipe trench PT. The protective material which fills the pipe trench PT may extend from the protective material formed in the peripheral region or the high-voltage transistor region as described above with reference to FIG. 3C. Subsequently, the protective material may be planarized by CMP to expose the upper conductive layer 105B. As a result, a sacrificial pattern 107P2 may be formed in the pipe trench PT. According to the above-described processes, the sacrificial pattern 107P2 may be formed at the same time when the etch stop patterns are formed in the peripheral region or the high-voltage transistor region as described above with reference to FIG. 3C.

Subsequently, the second conductive layer 109L may be formed. The second conductive layer 109L may be formed on the first conductive layer 105L including the lower conductive layer 105A and the upper conductive layer 105B. The first conductive layer 105L may include (i) the pipe trench PT filled with the sacrificial pattern 107P2 and formed in the cell array region and (ii) the concave portions filled with the etch stop patterns and formed in the peripheral region or the high-voltage transistor region as described above with reference to FIG. 3C. The second conductive layer 109L formed in the cell array region as shown in FIG. 5C may extend from the second conductive layer formed in the peripheral region or the high-voltage transistor region as shown in FIG. 3C.

Subsequently, the third mask pattern MK may be formed on the second conductive layer 109L in the cell array region. Specifically, the third mask pattern MK may be formed at the same time when the third mask pattern is formed over the second conductive layer 109L in the peripheral region or the high-voltage transistor region as described above in FIG. 3C. The third mask pattern MK may define a pattern of the pipe gate in the cell array region.

Figure 5D:
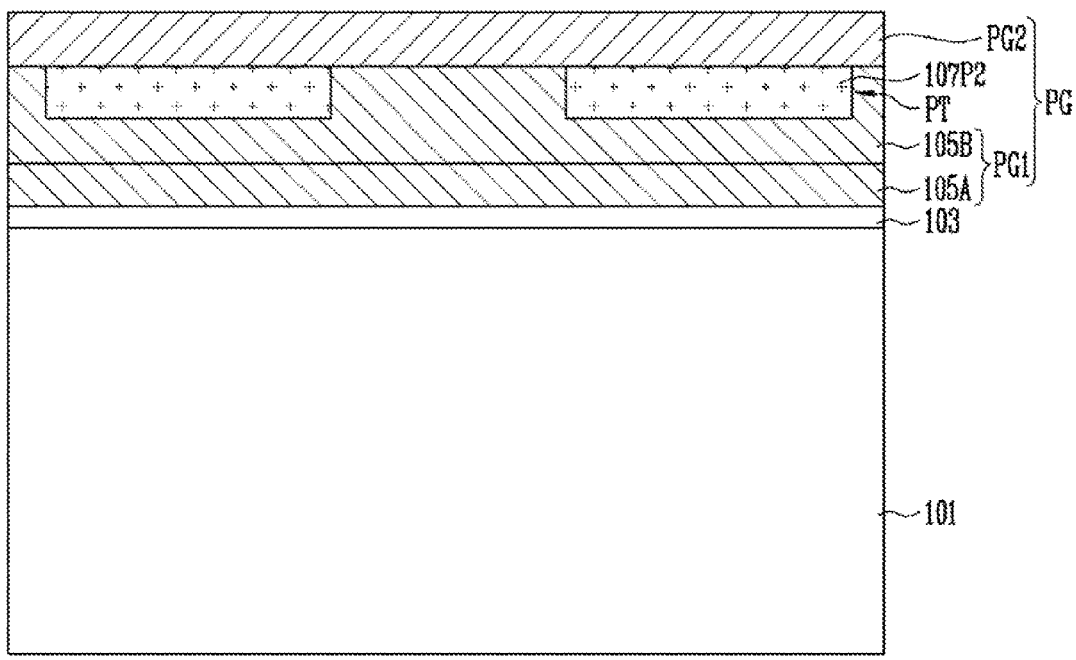

Referring to FIG. 5D, the second conductive layer 109L and the first conductive layer 105L may be selectively etched by an etch process using the third mask pattern MK as an etch barrier. See FIG. 3C along with FIG. 5D. As a result, the gate electrode may be formed in the high-voltage transistor region or the peripheral region as shown in FIG. 3D, and at the same time, the pipe gate PG including the first pipe gate pattern PG1 and the second pipe gate pattern PG2 may be formed in the cell array region.

Subsequently, as described above with reference to FIG. 3D, a source junction region and a drain junction region may be formed. Then, the third mask pattern MK may be removed.

Figure 5E:
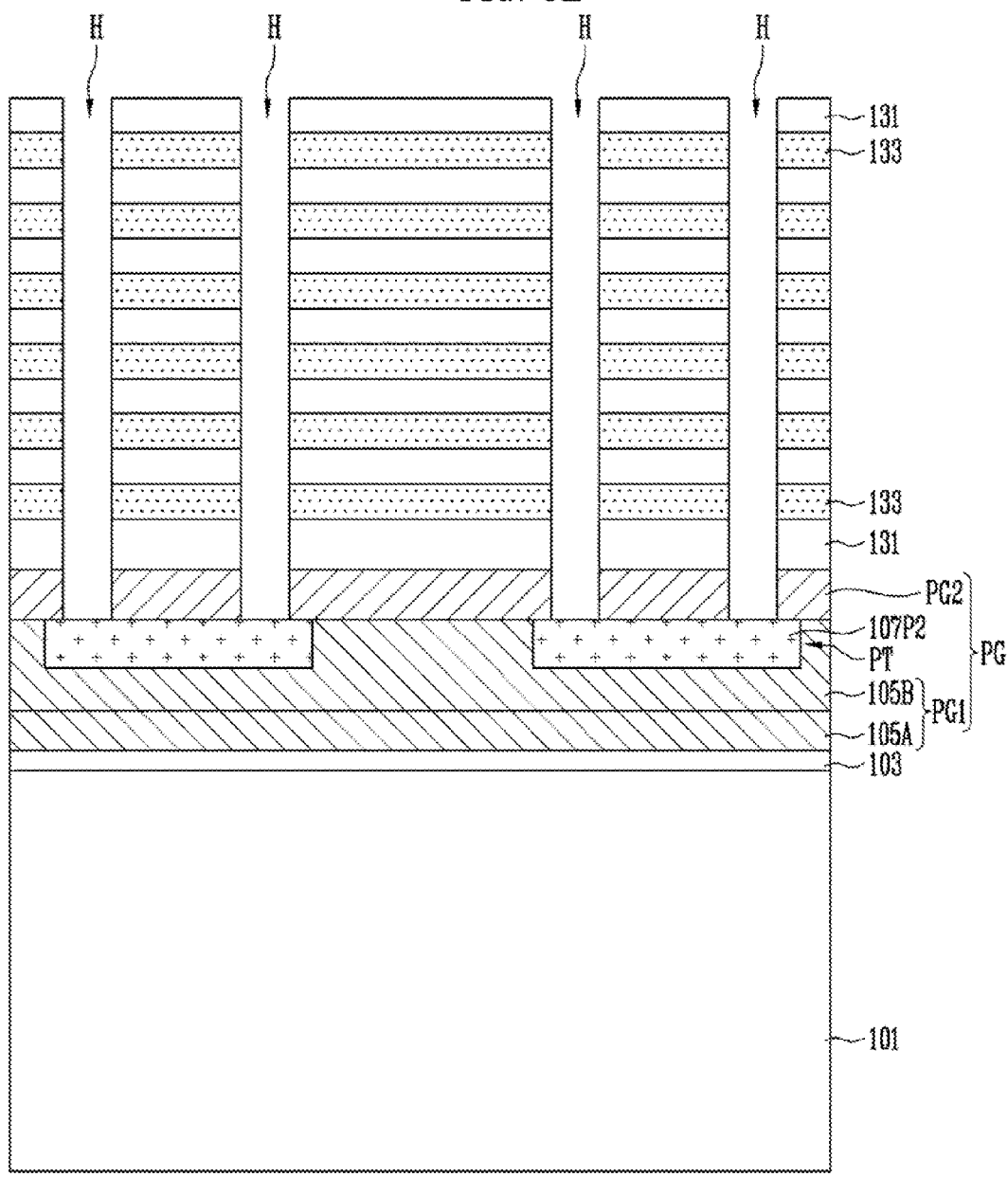

Referring to FIG. 5E, first material layers 131 and second material layers 133 may be alternately stacked over the pipe gate PG. The second material layer 133 may include a different material from the first material layer 131.

For example, the first material layer 131 may include insulating layers to form interlayer insulating patterns, and the second material layers 133 may include conductive layers to form word lines and selection lines.

The first material layers 131 may include insulating layers configured as interlayer insulating patterns. The second material layers 133 may include sacrificial insulating layers having an etch selectivity with respect to the first material layers 131. In an example, the first material layers 131 may include silicon oxide layers, and the second material layers 133 may include silicon nitride layers.

In another example, the first material layers 131 may include sacrificial conductive layers having an etch selectivity with respect to the second material layers 133. The second material layers 133 may include conductive layers serving as word lines and selection lines. In an example, the first material layers 131 may include undoped polysilicon layers, and the second material layers 133 may include doped polysilicon layers.

Subsequently, the first material layers 131, the second material layers 133 and the second pipe gate pattern PG2 may be etched by forming holes H through which the sacrificial pattern 107P2 are exposed. The sacrificial pattern 107P2 may be exposed through at least two holes H.

Figure 5F:
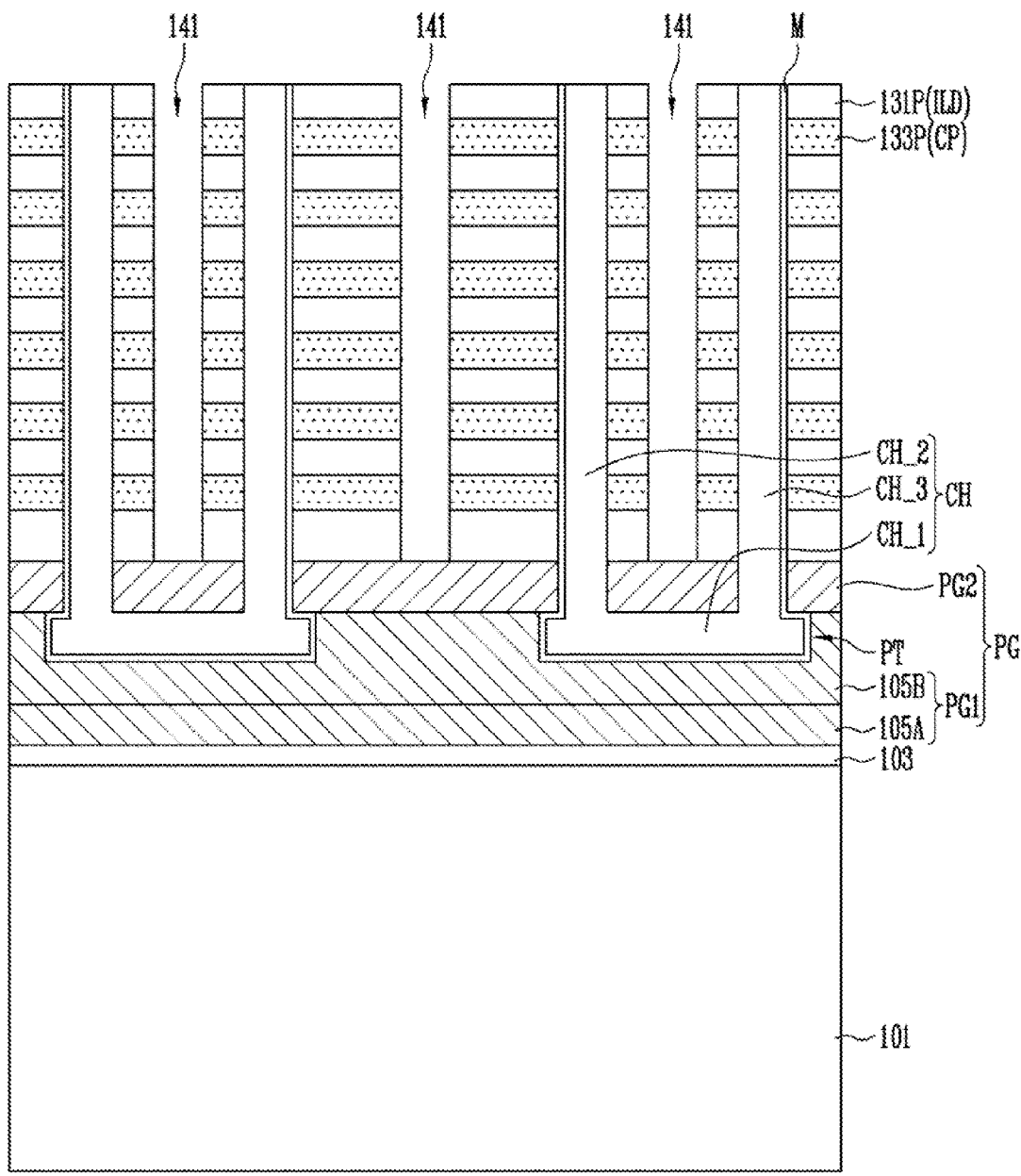

Referring to FIG. 5F, the sacrificial pattern 107P2 exposed through the holes H may be removed to open the pipe trench PT. Subsequently, the channel layer CH may be formed on the pipe trench PT and the holes H. As described above with reference to FIG. 4, the channel layer CH may include the first to third channel portions CH_1 to CH_3. The channel layer CH may have a tubular shape surrounding an insulating material. In another example, the channel layer CH may be a buried channel layer which completely fills the pipe trench PT and the holes H.

Before the channel layer CH is formed, the multilayer film M of three or more layers, for example, including a blocking insulating layer, a data storage layer, and a tunnel insulating layer may be formed on surfaces of the pipe trench PT and the holes H.

Subsequently, the first and second material layers 131 and 133 may be etched to form a slit 141 passing through the first and second material layers 131 and 133. The slit 141 may be formed between the holes H. By the slit 141 located between the holes H, a single stack including the first material layers 131 and the second material layers 133 is divided into two stacks including first patterns 131P and second patterns 133P. Before the slit 141 is formed, the first and second material layers 131 and 133 may be removed from the peripheral region including the high-voltage transistor region described above with reference to FIGS. 1A, 1B, 2A, 2B and 3A to 3D.

Subsequent processes may vary depending on materials forming the first and second material layers 131 and 133.

For example, when the first material layers 131 include insulating layers and the second material layers 133 include conductive layers serving as word lines and selection lines, the first patterns 131P and the second patterns 133P formed by the slit 141 may correspond to the interlayer insulating patterns ILD and the conductive patterns CP, respectively, as described above with reference to FIG. 4. Each of the first patterns 131P and the second patterns 133P may form the source side stacked body or the drain side stacked body described above with reference to FIG. 4.

In another example, when the first material layers 131 include insulating layers configured as interlayer insulating patterns, and the second material layers 133 may include sacrificial Insulating layers, the process shown in FIG. 5G may be performed.

Referring to FIG. 5G, the second patterns 133P exposed through the slit 141 may be removed to open conductive pattern regions between the first patterns 131P disposed at different levels.

Subsequently, third patterns 145P may be formed in the conductive pattern regions. The third patterns 145P may correspond to the conductive patterns CP shown in FIG. 4. The first patterns 131P may correspond to the interlayer insulating patterns ILD shown in FIG. 4. The third pattern 145P may include at least one of a polysilicon layer, a metal silicide layer and a metal layer. When the third pattern 145P includes a metal layer, such as tungsten having a lower resistance than polysilicon, a barrier metal, such as TiN, may be further formed on a surface of the third pattern 145P. Before the channel layer CH shown in FIG. 5F is formed, if the multilayer film M is not formed, the multilayer film M may be formed on the surface of the conductive pattern region before the third pattern 145P is formed.

Though not shown in FIG. 5G, when the first material layers 131 include sacrificial conductive layers and the second material layers 133 include conductive layers, the second patterns 133P may correspond to the conductive patterns CP shown in FIG. 4. The first patterns 131P exposed through the slit 141 may be removed. As a result, insulating pattern regions between the second patterns 133P disposed at different levels may be opened. Subsequently, the Interlayer insulating patterns ILD as shown in FIG. 4 may be formed by filling the insulating pattern regions with an insulating material.

As described above, according to an embodiment, since etch stop patterns formed in a high-voltage transistor region are formed at the same time as a sacrificial pattern formed in a cell array region, a separate process for forming the etch stop patterns may not be required.

According to an embodiment, etch stop patterns overlapping with insulation pillars may be buried in a gate electrode formed in a high-voltage transistor region of a peripheral region. Therefore, both ends of the gate electrode of a high voltage transistor may be self-aligned to overlap with the insulation pillars. According to an embodiment, it may be easier to overlap the gate electrode of the high voltage transistor with the insulation pillars. Thus, a misalignment error may be reduced when the gate electrode of the high voltage transistor is formed.

According to an embodiment, leakage current may be reduced by overlapping both ends of a gate electrode of a high voltage transistor with insulation pillars, so that characteristics of the high voltage transistor may be improved.

Figure 6:
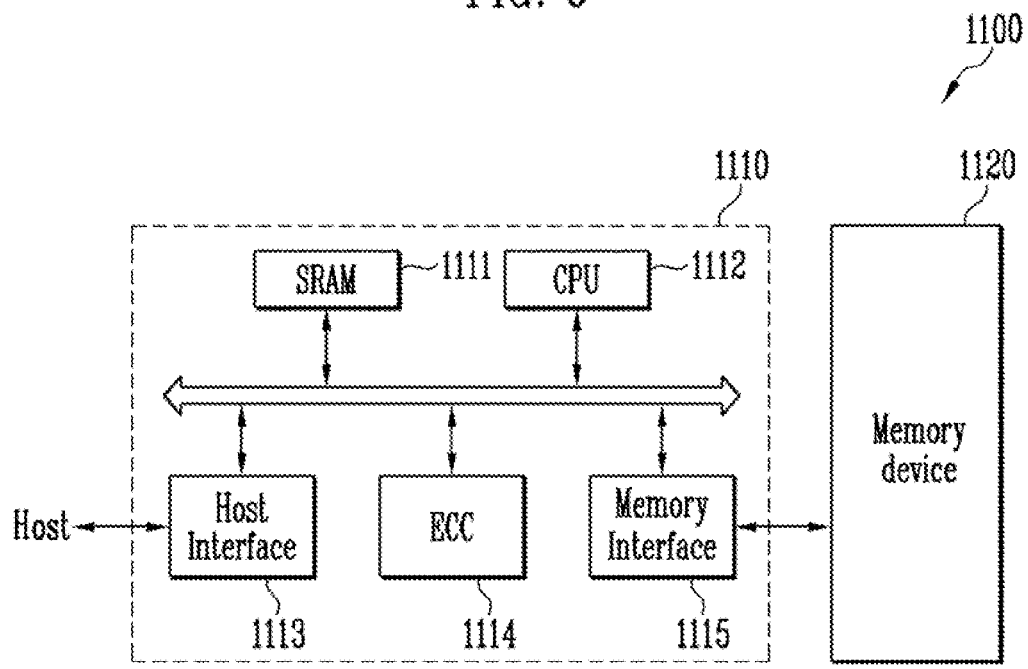
FIG. 6 is a view illustrating the configuration of a memory system according to an embodiment.

FIG. 6 is a block diagram illustrating the configuration of a memory system according to an embodiment. As illustrated in FIG. 6, a memory system 1100 according to an embodiment may include a non-volatile memory device 1120 and a memory controller 1110.

The non-volatile memory device 1120 may have the above-described structure with reference to FIGS. 1A to 5G. In addition, the non-volatile memory device 1120 may be a multi-chip package including a plurality of flash memory chips.

The memory controller 1110 may be configured to control the non-volatile memory device 1120. The memory controller 1110 may include static random access memory (SRAM) 1111, a central processing unit (CPU) 1112, a host interface 1113, an error check and correction unit (ECC) 1114 and a memory interface 1115. The SRAM 1111 may function as an operation memory of the CPU 1112. The CPU 1112 may perform general control operations for data exchange with the memory controller 1110. The host interface 1113 may include a data exchange protocol for a host coupled to the memory system 1100. In addition, the ECC 1114 may detect and correct errors included in data read from the non-volatile memory device 1120. The memory interface 1115 may interface between the non-volatile memory device 1120 and a memory controller 1110. The memory controller 1110 may further include a read-only memory (ROM) that stores code data to interface with the host.

The memory system 1100 having the above-described configuration may be a solid state disk (SSD) or a memory card in which the memory device 1120 and the memory controller 1110 are combined. For example, when the memory system 1100 is an SSD, the memory controller 1110 may communicate with an external device for example, a host through one of the interface protocols including USB, MMC, PCI-E, SATA, PATA, SCSI, ESDI and IDE.

Figure 7:
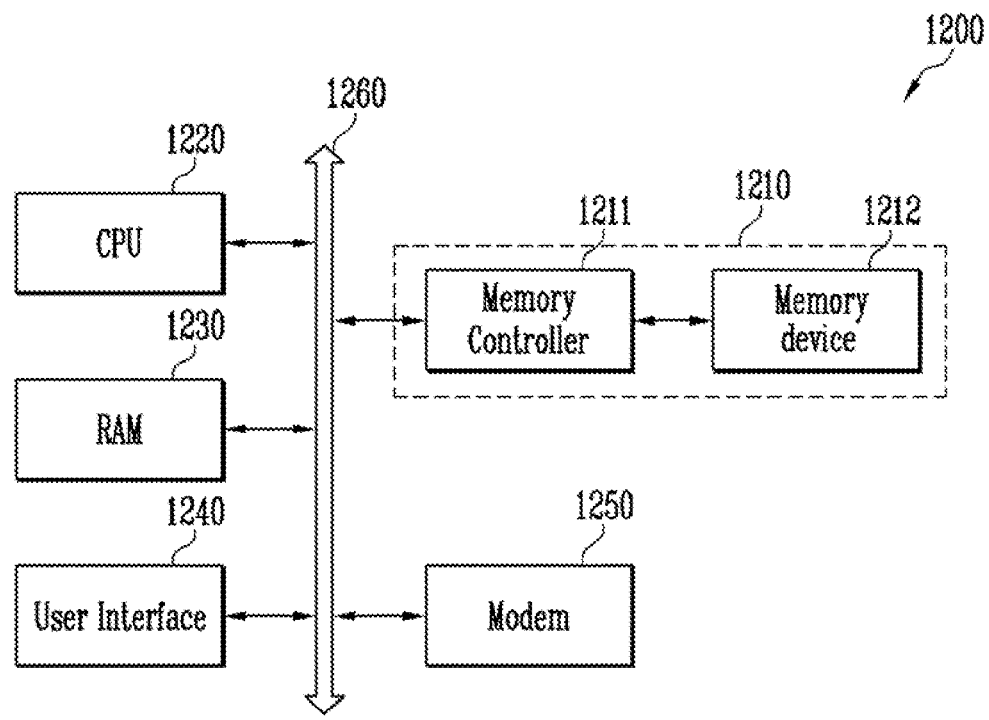
FIG. 7 is a view illustrating the configuration of a computing system according to an embodiment.

FIG. 7 is a block diagram illustrating the configuration of a computing system according to an embodiment.

Referring to FIG. 7, a computing system 1200 according to an embodiment may include a CPU 1220, RAM 1230, a user interface 1240, a modem 1250 and a memory system 1210 that are electrically coupled to each other by a system bus 1260. In addition, when the computing system 1200 is a mobile device, a battery may be further included to apply an operating voltage to the computing system 1200. The computing system 1200 may further include application chipsets, a Camera Image Processor (CIS), or mobile DRAM.

As described above in connection with FIG. 6, the memory system 1210 may include a non-volatile memory 1212 and a memory controller 1211.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A semiconductor device, comprising:
   a substrate including a high-voltage transistor region in which an active region is defined;
   insulation pillars separated from each other and formed in the active region;
   a gate electrode disposed over the substrate, wherein both ends of the gate electrode overlap with the insulation pillars, respectively; and
   etch stop patterns buried in the gate electrode and overlapping with the insulation pillars, respectively.

2. The semiconductor device of claim 1, wherein the gate electrode comprises:
   a first conductive pattern including concave portions filled with the etch stop patterns; and
   a second conductive pattern disposed over the first conductive pattern and contacting the first conductive pattern.

3. The semiconductor device of claim 2, wherein the first conductive pattern comprises:
   a lower conductive layer disposed between the insulation pillars and over the substrate; and
   an upper conductive layer disposed over the lower conductive layer and including the concave portions.

4. The semiconductor device of claim 2, wherein the second conductive pattern has a smaller width than the first conductive pattern so that at least a portion of the etch stop patterns is exposed.

5. The semiconductor device of claim 1, wherein a width of each of the etch stop patterns is greater than a width of each of the insulation pillars.

6. The semiconductor device of claim 1, wherein each of the etch stop patterns has a first sidewall overlapping with one of the insulation pillars and a second sidewall overlapping with the active region between the insulation pillars.

7. The semiconductor device of claim 1, further comprising:
   a source junction region and a drain junction region formed in the active region at both sides of the gate electrode, respectively; and
   connecting junction regions connected to the source junction region and the drain junction region, respectively, and formed in a surface of the substrate adjacent to the insulation pillars.

8. The semiconductor device of claim 7, further comprising:
   contact plugs disposed over the source junction region and the drain junction region, respectively,
   wherein the insulation pillars and the gate electrode are disposed between the contact plugs.

9. A semiconductor device, comprising:
   a substrate including a cell array region and a peripheral region, wherein the peripheral region includes an active region;
   insulation pillars separated from each other and formed in the active region in the peripheral region;
   a gate electrode disposed over the substrate, wherein both ends of the gate electrode overlap with the insulation pillars, respectively;
   etch stop patterns buried in the gate electrode and overlapping with the insulation pillars, respectively;
   a pipe gate disposed over the substrate in the cell array region;
   a pipe trench formed in the pipe gate; and
   a first channel portion formed in the pipe trench.

10. The semiconductor device of claim 9, wherein the gate electrode is disposed at the same level as the pipe gate.

11. The semiconductor device of claim 9, wherein the etch stop patterns are disposed at the same level as the pipe trench.

12. The semiconductor device of claim 9, wherein the gate electrode comprises:
   a first conductive pattern including concave portions, wherein the concave portions are filled with the etch stop patterns and disposed at the same level as the pipe trench; and
   a second conductive pattern disposed over the first conductive pattern.

13. The semiconductor device of claim 12, wherein the pipe gate comprises:
   a first pipe gate pattern disposed at the same level as the first conductive pattern, including the pipe trench, and including the first channel portion formed in the pipe trench; and
   a second pipe gate pattern disposed over the first pipe gate pattern and disposed at the same level as the second conductive pattern.

14. The semiconductor device of claim 12, wherein the second conductive pattern exposes at least a portion of the etch stop patterns and has a smaller width than the first conductive pattern.

15. The semiconductor device of claim 9, further comprising:
- a second channel portion and a third channel portion extending from the first channel portion;
- a source side stacked body surrounding the second channel portion and including first interlayer insulating patterns and first conductive patterns stacked alternately with each other; and
- a drain side stacked body surrounding the third channel portion and including second interlayer insulating patterns and second conductive patterns stacked alternately with each other.

16. The semiconductor device of claim 9, wherein each of the etch stop patterns has a first sidewall overlapping with one of the insulation pillars and a second sidewall overlapping with the active region between the insulation pillars.

17. A semiconductor device, comprising:
- a substrate provided in a peripheral region;
- first and second insulation pillars formed in the substrate; and
- a gate electrode extending in a first direction from over the first insulation pillar to over the second insulation pillar,
- wherein the gate electrode includes first and second etch stop patterns,
- wherein the first etch stop pattern extends in the first direction from inside the gate electrode to over the first insulation pillar, and
- wherein the second etch stop pattern extends in the first direction from inside the gate electrode to over the second insulation pillar.

18. The semiconductor device of claim 17, further comprising:
- a source junction and a drain junction formed in the substrate,
- wherein the first insulation pillar is formed in the substrate between the source junction and the gate electrode, and
- wherein the second insulation pillar is formed in the substrate between the drain junction and the gate electrode.

19. The semiconductor device of claim 17,
- wherein the first etch stop pattern extends from over the substrate between the first and the second insulation pillars to over the first insulation pillar, and
- wherein the second etch stop pattern extends from over the substrate between the first and the second insulation pillars to over the second insulation pillar.

20. The semiconductor device of claim 17,
- wherein the gate electrode includes first and second conductive patterns,
- wherein the first conductive pattern is provided at a first level,
- wherein the second conductive pattern is formed over the first conductive pattern and provided at a second level,
- wherein each of the first and the second etch stop patterns is provided between the first and the second conductive patterns, and
- wherein the first conductive pattern extends from the first level through between the first and the second etch stop patterns to the second level so that the first conductive pattern and the second conductive pattern are coupled to each other.

* * * * *